(12) United States Patent
Onishi et al.

(10) Patent No.: US 6,900,109 B2
(45) Date of Patent: May 31, 2005

(54) METHOD OF MANUFACTURING A SEMICONDUCTOR DEVICE WITH A VERTICAL DRAIN DRIFT LAYER OF THE ALTERNATING-CONDUCTIVITY-TYPE

(75) Inventors: Yasuhiko Onishi, Nagano (JP); Tatsuhiko Fujihira, Nagano (JP); Susumu Iwamoto, Nagano (JP); Takahiro Sato, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 10/376,662

(22) Filed: Feb. 28, 2003

(65) Prior Publication Data

US 2003/0148559 A1 Aug. 7, 2003

Related U.S. Application Data

(62) Division of application No. 09/693,574, filed on Oct. 20, 2000, now Pat. No. 6,611,021.

(30) Foreign Application Priority Data

Oct. 20, 1999 (JP) ............................................. 11-298037

(51) Int. Cl.[7] .............................................. H01L 21/76
(52) U.S. Cl. ...................................... 438/419; 438/529
(58) Field of Search ................................. 438/419, 529, 438/545, 549, FOR 234, FOR 309, FOR 314

(56) References Cited

U.S. PATENT DOCUMENTS

| | | |
|---|---|---|
| 4,754,310 A | 6/1988 | Coe |
| 5,141,889 A | 8/1992 | Terry et al. |
| 5,183,769 A | 2/1993 | Rutter et al. |
| 5,216,275 A | 6/1993 | Chen |
| 5,286,655 A | 2/1994 | Tsunoda |
| 5,292,672 A | 3/1994 | Akiyama et al. |
| 5,438,215 A | 8/1995 | Tihanyi |
| 5,798,554 A | 8/1998 | Grimaldi et al. |

(Continued)

FOREIGN PATENT DOCUMENTS

| | | |
|---|---|---|
| EP | 0053854 | 2/1986 |
| JP | 54-22179 A | 2/1979 |
| JP | 1-93169 A | 4/1989 |
| JP | 401272158 A | 10/1989 |
| JP | 3-105975 A | 5/1991 |
| JP | 10-223896 | 8/1998 |
| JP | 2000-40822 A | 2/2000 |

OTHER PUBLICATIONS

"Theory of Semiconductor Superjunction Devices"; Tatsuhiko Fujihira; Jpn. J. Appl. Phys. vol. 36 (1997), Part 1 No. 10, Oct. 1997; pp. 6254–6262.

Primary Examiner—George Fourson
Assistant Examiner—Thanh Pham
(74) Attorney, Agent, or Firm—Rossi, Kimms & McDowell

(57) ABSTRACT

A semiconductor device includes an improved drain drift layer structure of alternating conductivity types, that is easy to manufacture, and that facilitates realizing a high current capacity and a high breakdown voltage and to provide a method of manufacturing the semiconductor device. The vertical MOSFET according to the invention includes an alternating-conductivity-type drain drift layer on an n[+]-type drain layer as a substrate. The alternating-conductivity-type drain drift layer is formed of n-type drift current path regions and p-type partition regions alternately arranged laterally with each other. The n-type drift current path regions and p-type partition regions extend in perpendicular to n[+]-type drain layer. Each p-type partition region is formed by vertically connecting p-type buried diffusion unit regions $U_p$. The n-type drift current path regions are residual regions, left after connecting p-type buried diffusion unit regions $U_p$, with the conductivity type thereof unchanged. The alternating-conductivity-type drain drift layer is formed by repeating the step of epitaxial layer growth and the step of implanting p-type impurity ions and by diffusing the impurity ions at once from the impurity sources located on multiple levels.

16 Claims, 14 Drawing Sheets

U.S. PATENT DOCUMENTS

| | | |
|---|---|---|
| 6,081,009 A | 6/2000 | Neilson |
| 6,097,063 A | 8/2000 | Fujihira |
| 6,184,555 B1 | 2/2001 | Tihanyi et al. |
| 6,198,141 B1 | 3/2001 | Yamazaki et al. |
| 6,207,994 B1 | 3/2001 | Rumennik et al. |
| 6,274,904 B1 | 8/2001 | Tihanyi |
| 6,300,171 B1 | 10/2001 | Frisina |
| 6,307,246 B1 | 10/2001 | Nitta et al. |
| 6,475,864 B1 | 11/2002 | Sato et al. |
| 6,551,909 B1 | 4/2003 | Fujihira |
| 6,677,626 B1 | 1/2004 | Shindou et al. |
| 2001/0028083 A1 | 10/2001 | Onishi et al. |
| 2001/0046739 A1 | 11/2001 | Miyasaka et al. |

METHOD OF MANUFACTURING A SEMICONDUCTOR DEVICE WITH A VERTICAL DRAIN DRIFT LAYER OF THE ALTERNATING-CONDUCTIVITY-TYPE

This is a Division of application Ser. No. 09/693,574 filed Oct. 20, 2000 now U.S. Pat. No. 6,611,021.

FIELD OF THE INVENTION

The present invention relates to a semiconductor structure applicable to semiconductor devices, such as a MOSFET (an insulated gate field effect transistor), an IGBT (an insulated gate bipolar transistor), a bipolar transistor and a diode, which simultaneously exhibit a high breakdown voltage and a high current capacity. More specifically, the present invention relates to a semiconductor device structure including a vertical drain drift layer and the method of manufacturing the semiconductor device.

BACKGROUND ART

The semiconductor devices may be roughly classified into a lateral device, that arranges the main electrodes thereof on one major surface, and a vertical device that distributes the main electrodes thereof on two major surfaces facing opposite to each other. In the vertical device, a drift current flows in the ON-state of the device and depletion layers expand in the OFF-state of the device both in the thickness direction of the substrate thereof (vertically). FIG. 9 is a cross sectional view of a conventional planar-type vertical n-channel MOSFET. Referring now to FIG. 9, the vertical MOSFET includes an n$^+$-type drain layer 11 with low electrical resistance; a drain electrode 18 in electrical contact with the back surface of n$^+$-type drain layer 11; a highly resistive n-type drain drift layer 12 on n$^+$-type drain layer 11; p-type base regions 13 (p-type well regions or channel diffusion regions) formed selectively in the surface portion of drain drift layer 12; a heavily doped n$^+$-type source region 14 formed selectively in the surface portion of p-type base region 13; a heavily doped p$^+$-type contact region 19 formed selectively in the surface portion of p-type base region 13; a gate insulation film 15 on the extended portion of p-type base region 13 extended between n-type drain drift layer 12 and n$^+$-type source region 14; a polysilicon gate electrode layer 16 on gate insulation film 15; and a source electrode 17 in common contact with n$^+$-type source region 14 and p$^+$-type contact region 19.

Highly resistive n-type drain drift layer 12 provides a vertical drift current path in the ON-state of the MOSFET and is depleted in the OFF-state of the MOSFET to increase the breakdown voltage. Shortening the current path in n-type drain drift layer 12 is effective to substantially reduce the on-resistance (the resistance between the source and the drain) of the MOSFET, since the drift resistance is reduced. However, the shortening the current path in n-type drain drift layer 12 narrows the expansion width of the depletion layer expanding from the pn-junction between p-type base region 13 and n-type drain drift layer 12. Since the depletion electric field strength soon reaches the maximum electric field (critical electric field) of silicon due to the narrowed expansion width of the depletion layer, the breakdown voltage (the voltage between the drain and the source) of the MOSFET is reduced. Although a high breakdown voltage is obtained by thickening n-type drain drift layer 12, thick n-type drain drift layer 12 inevitably causes on-resistance increase, that further causes on-loss increase. In other words, there exists a tradeoff relation between the on-resistance (current capacity) and the breakdown voltage. The tradeoff relation between the on-resistance and the breakdown voltage exists also in the other semiconductor devices such as IGBT's, bipolar transistors and diodes.

European Patent 0 053 854, U.S. Pat. No. 5,216,275, U.S. Pat. No. 5,438,215, Japanese Unexamined Laid Open Patent Application H09-266311 and Japanese Unexamined Laid Open Patent Application H10-223896 disclose semiconductor devices, which include an alternating conductivity type layer formed of heavily doped n-type regions and heavily doped p-type regions alternately arranged with each other to obviate the problems described above.

FIG. 10 is a cross sectional view of the vertical MOSFET disclosed in U.S. Pat. No. 5,216,275. The vertical MOSFET of FIG. 10 is different from the vertical MOSFET of FIG. 9 in that the vertical MOSFET of FIG. 10 includes a drain drift layer 22, that is not of one conductivity type but of alternating conductivity types and formed of n-type drift current path regions 22a and p-type partition regions 22b alternately arranged with each other. Even if the impurity concentrations in the alternating conductivity type layer are high, a high breakdown voltage will be obtained, since depletion layers expand laterally, in the OFF-state of the device, from multiple pn-junctions extending vertically across the alternating conductivity type layer.

Drain drift layer 22 is formed in the following way. An n-type layer is grown epitaxially on an n$^+$-type drain layer 11 as a substrate. Trenches are dug through n-type layer down to n$^+$-type drain layer 11, leaving n-type drift current path regions 22a. Then, p-type partition regions 22b are epitaxially grown selectively in the trenches. Hereinafter, the semiconductor device including a drain drift layer of alternating conductivity types as described above will be referred to sometimes as the "super-junction semiconductor device".

Detailed dimensions of the super-junction semiconductor device disclosed in U.S. Pat. No. 5,216,275 are as follows. The thickness of drain drift layer 22 is described with a breakdown voltage $V_B$ by $0.024V_B^{1.2}$ ($\mu$m). When the thickness of n-type drift current path regions 22a and the thickness of p-type partition region 22b are the same b and the impurity concentrations in n-type drift current path regions 22a and p-type partition region 22b are the same N, the impurity concentration and the thickness b are related with each other by $N=7.2\times10^{16}V_B^{0.2}$b (cm$^3$). When $V_B$ is 800 V and b is 5 $\mu$m, the impurity concentration N is $1.9\times10^{16}$ cm$^3$. Since the impurity concentration in the conventional drain drift layer of one conductivity type is around $2\times10^{14}$ cm$^3$, the drain drift layer of alternating conductivity types facilitates realizing a high impurity concentration therein, reducing the on-resistance and providing the semiconductor device with a high breakdown voltage.

However, the trenches for forming p-type partition regions 22b are narrow and deep. It is difficult for the presently available selective etching techniques to dig the trenches with such a large aspect ratio, and it is difficult for the presently available epitaxial growth techniques to grow a high-quality single crystal layer in such a narrow and deep trench. Since it is required to further narrow and thicken each region in the drain drift layer of alternating conductivity types to obtain a higher breakdown voltage, the aspect ratio of the trenches for forming the p-type partition regions should inevitably be larger. Obviously, the use of trenches for forming the p-type partition regions causes a limit for obtaining a higher breakdown voltage and, therefore, is not so practical.

In view of the foregoing, it is an object of the invention to provide a semiconductor device including an improved drain drift layer structure of alternating conductivity types, that is easy to manufacture. It is another object of the invention to provide a semiconductor device that facilitates realizing a high current capacity and a high breakdown voltage. It is still another object of the invention to provide a method of manufacturing the semiconductor device.

SUMMARY OF THE INVENTION

According to an aspect of the present invention, there is provided a semiconductor device including: an alternating conductivity type layer formed of vertical first regions of a first conductivity type and vertical second regions of a second conductivity type; the vertical first regions and the vertical second regions being alternately arranged with each other; each of the vertical first regions or each of the vertical second regions being formed of epitaxially grown layers laminated with each other; and each of the vertical second regions or each of the vertical first regions being formed of buried diffusion unit regions connected vertically with each other.

Since the vertical first regions or the vertical second regions are built in by connecting buried diffusion unit regions vertically, the impurity concentration in the vertical first regions or the vertical second regions exhibits almost isotropic distributions around the scattered diffusion centers aligned vertically. Although the impurity concentration distribution in the vertical first regions or the vertical second regions is not uniform, pn-junction planes between the vertical first regions and the vertical second regions are almost flat. Since the narrow vertical first regions, which provide a vertical current path in the ON-state of the semiconductor device, can be doped heavily, the alternating conductivity type layer according to the invention facilitates realizing a high current density. Since the vertical second regions are depleted in the OFF-state of the semiconductor device by the depletion layers expanding laterally from the pn-junctions on both sides thereof, alternating conductivity type layer according to the invention facilitates realizing also a high breakdown voltage.

The vertical first regions and the vertical second regions having the structures as described above are formed according to the invention by repeating the step of laminating epitaxially grown layer with the step of implanting impurity ions of one conductivity type into the diffusion centers in the surface portion of the latest epitaxially grown layer interposed between the steps of laminating and by thermally diffusing the impurities stored between the epitaxially grown layers at once to connect the buried diffusion unit regions vertically with each other. The manufacturing method according to the invention facilitates narrowing and elongating the vertical first regions and the vertical second regions.

Since it is not necessary to dig trenches with a large aspect ratio by etching nor to epitaxially grow layers selectively in the trenches, the manufacturing method according to the invention facilitates easy manufacture of the super-junction semiconductor device. Since it is enough to implant impurity ions of only one conductivity type, the manufacturing method according to the invention facilitates confining concentration distributions within a narrow range and reducing the manufacturing steps. Therefore, the manufacturing method according to the invention facilitates forming an alternating conductivity type layer including narrow regions alternately arranged with each other and, therefore, providing a practical vertical super-junction semiconductor device.

The alternating conductivity type layer and the method of manufacturing the alternating conductivity type layer according to the invention are applicable not only to the vertical semiconductor devices distributing the main electrodes thereof on both major surfaces of the semiconductor chip facing opposite to each other but also to the lateral semiconductor devices having the main electrodes thereof on one major surface of the semiconductor chip. The invention is applicable to the semiconductor device including an alternating conductivity type layer shaped with a letter V and to manufacturing the semiconductor device.

The alternating conductivity type layer according to the invention includes vertical first regions or vertical second regions formed in the laminate of epitaxially grown layers by three-dimensionally driving buried diffusion unit regions by thermally diffusing the impurities at once from the impurity sources (diffusion centers) formed in advance between the epitaxially grown layers. The vertical first regions or the vertical second regions may be extended obliquely to the major surface of the semiconductor device. The alternating conductivity type layer may three-dimensionally extend zigzag or helically. The zigzag arrangement or the helical arrangement of the alternating conductivity type layer facilitates providing a drift current path longer than the thickness of the alternating conductivity type layer and, therefore, a higher breakdown voltage. The vertical first regions or the vertical second regions may be extended obliquely by connecting the buried diffusion unit regions displaced laterally for a certain distance from an epitaxially grown layer to another epitaxially grown layer. Although it is impossible in principle for the trench structure to built in oblique drift current path regions or oblique partition regions in the alternating conductivity type layer, the method of connecting the buried diffusion unit regions according to the invention facilitates forming oblique drift current path regions or oblique partition regions in the alternating conductivity type layer. Although the method of connecting the buried diffusion unit regions according to the invention is not so effective to form an active region nor a passive region of the semiconductor device, the method of connecting the buried diffusion unit regions according to the invention is applicable to forming drift regions, internal vertical current path regions and pn-isolation regions. The method of connecting the buried diffusion unit regions according to the invention is applicable to the vertical wiring between the devices laminated in a semiconductor chip.

According to another aspect of the present invention, there is provided a method of manufacturing a semiconductor device including an alternating conductivity type layer formed of vertical first regions of a first conductivity type and vertical second regions of a second conductivity type, the vertical first regions and the vertical second regions being alternately arranged with each other, each of the vertical first regions or each of the vertical second regions being formed of epitaxially grown layers laminated with each other, and each of the vertical second regions or each of the vertical first regions being formed of buried diffusion unit regions connected vertically with each other, the method including the steps of: (a) forming an epitaxially grown layer doped relatively lightly on a substrate; (b) selectively implanting impurity ions of the second conductivity type or the first conductivity type into diffusion centers in the surface portion of the epitaxially grown layer; (c) repeating the steps (a) and (b) to form a laminate including a desired number of the diffusion centers aligned vertically; and (d) thermally diffusing the implanted impurity ions from the diffusion centers to connect the buried diffusion unit regions vertically with each other.

Alternatively, there is provided a method of manufacturing a semiconductor device including an alternating conductivity type layer formed of vertical first regions of a first conductivity type and vertical second regions of a second conductivity type, the vertical first regions and the vertical second regions being alternately arranged with each other, each of the vertical first regions or each of the vertical second regions being formed of epitaxially grown layers laminated with each other, and each of the vertical second regions or each of the vertical drift current path regions being formed of buried diffusion unit regions connected vertically with each other, the method including the steps of: (a) selectively implanting impurity ions of the second conductivity type or the first conductivity type into diffusion centers in the surface portion of a substrate; (b) forming an epitaxially grown layer doped relatively lightly on the substrate; (c) selectively implanting impurity ions of the second conductivity type or the first conductivity type into diffusion centers in the surface portion of the epitaxially grown layer; (d) repeating the steps (b) and (c) to form a laminate including a desired number of the diffusion centers aligned vertically; and (e) thermally diffusing the implanted impurity ions from the diffusion centers to connect the buried diffusion unit regions vertically with each other.

Layers with low electrical resistance may be formed to laterally connect the thus formed drift current path regions. In the steps of forming an epitaxially grown layer, the conductivity type of the epitaxially grown layers may be opposite to the conductivity type of the substrate.

The ion implantation method facilitates positioning the maximum concentration points (the impurity sources) at the depth corresponding to the average range from the surface of the area, through which impurity ions are implanted, and lowering the local impurity concentrations in the surface portions, through which the impurity ions are implanted. Since the ion implantation method facilitates keeping the boundary planes between the epitaxially grown layers clean, the crystal qualities in the respective laminated epitaxially grown layers are equalized, the influences of auto-doping are reduced, and the impurity concentrations in epitaxially grown layers, which determine the conductivity type of the epitaxially grown layers, are equalized. Since the crystal qualities in the epitaxially grown layers are impaired more with increasing number of the laminated epitaxially grown layers, the ion implantation method is very useful for manufacturing the devices including an active region or a passive region formed on the uppermost epitaxially grown layer. In some cases, it is appropriate to form layers with low electrical resistance in the uppermost epitaxially grown layer and to form an active region of the device in the epitaxially grown layers on the side of the substrate, thereon the epitaxially grown layers are formed.

Although defect (amorphous) layers are caused in the surface portions corresponding to the locations of the windows, through which the impurity ions are implanted, the defect layers do not pose any problems, since the defect layers are annealed easily to be crystallized again by the final heat treatment. As the vertical regions in the alternating conductivity type layer are narrower, a higher breakdown voltage is obtained. To obtain a higher breakdown voltage, a narrower window is used for the ion implantation. Even when some arrays of point defects are remaining, the remaining point defects do not pose any problem on the drift current path regions, since the point defects are confined in narrow regions beneath the surface portions corresponding to the windows, through which impurity ions are implanted.

Advantageously, the step of non-selectively implanting impurity ions of the first conductivity type or the second conductivity type in the entire surface portion of the epitaxially grown layer is inserted between the preceding step of forming an epitaxially grown layer and the succeeding step of forming an epitaxially grown layer. It is appropriate to non-selectively implant the impurity ions of the same conductivity type with that of the epitaxially grown layers. The non-selective implantation, that increases or compensates the impurity concentration in the epitaxially grown layers, facilitates increasing the impurity concentrations in the alternating conductivity type layer and, therefore, increasing the current capacity. The initial conductivity type of the epitaxially grown layers at the time of the epitaxial growth thereof may be n-type or p-type, since the final impurity concentrations in the alternating conductivity type layer are determined by the concentration of the non-selectively implanted impurity ions of the first conductivity type or the second conductivity type. Preferably, the impurity concentration in the epitaxially grown layers is between $2 \times 10^{13}$ cm$^3$ and $1 \times 10^{16}$ cm$^3$. The preferable impurity concentration facilitates suppressing impurity concentration distribution and realizing a high breakdown voltage and a high current capacity.

Preferably, the steps of implanting impurity ions of the first conductivity type and the second conductivity type are conducted using ion implantation facilities of the same series supplied from the same manufacturer. The concentration distribution is further reduced.

More preferably, the steps of implanting ions of the first conductivity type and the steps of implanting ions of the second conductivity type are conducted using respective ion implantation facilities of the same type supplied from the same manufacturer.

Most preferably, the steps of implanting ions of the first conductivity type and the steps of implanting the ions of the second conductivity type are conducted using the same ion implantation facility.

BRIEF DESCRIPTION OF THE DRAWING FIGURES

FIG. 1 is a cross sectional view of a vertical n-channel MOSFET according to a first embodiment of the invention.

FIGS. 2(a) through 2(d) are cross sectional views for explaining the steps of forming the alternating-conductivity-type drain drift layer of FIG. 1.

FIGS. 4(a) through 4(e) are cross sectional views for explaining a method of manufacturing a vertical MOSFET according to a second embodiment of the invention.

FIGS. 5(a) through 5(f) are cross sectional views for explaining a method of manufacturing a vertical MOSFET according to a third embodiment of the invention.

Figure 5A:
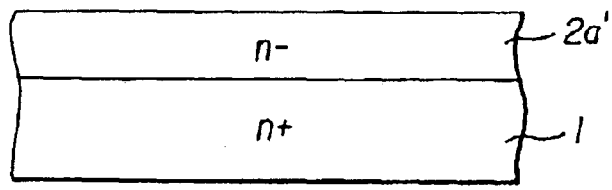
Figure 5B:
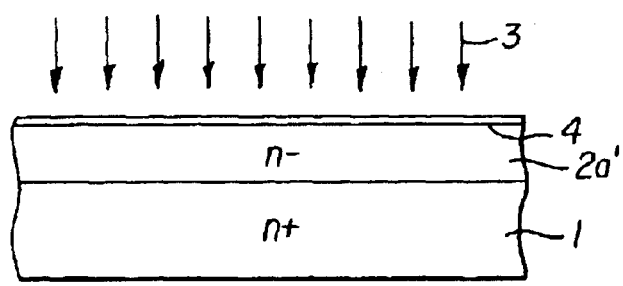
Figure 5C:
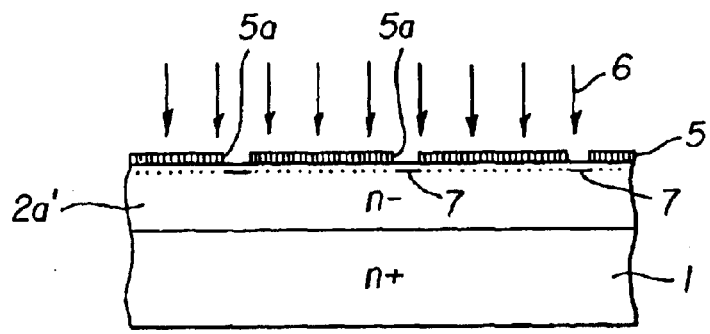
Figure 5D:
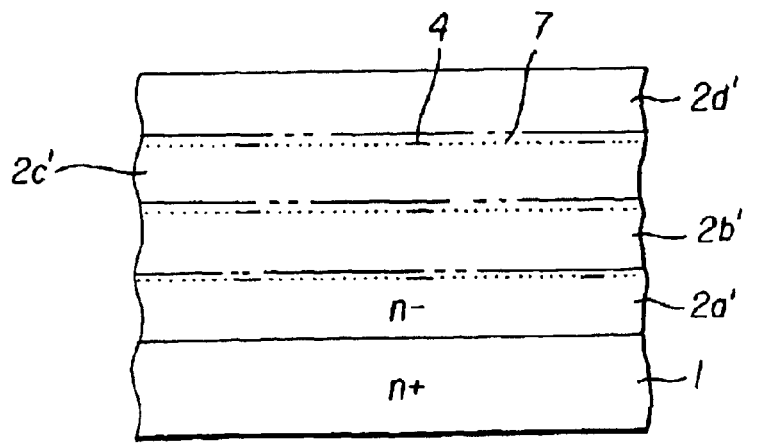
Figure 5E:
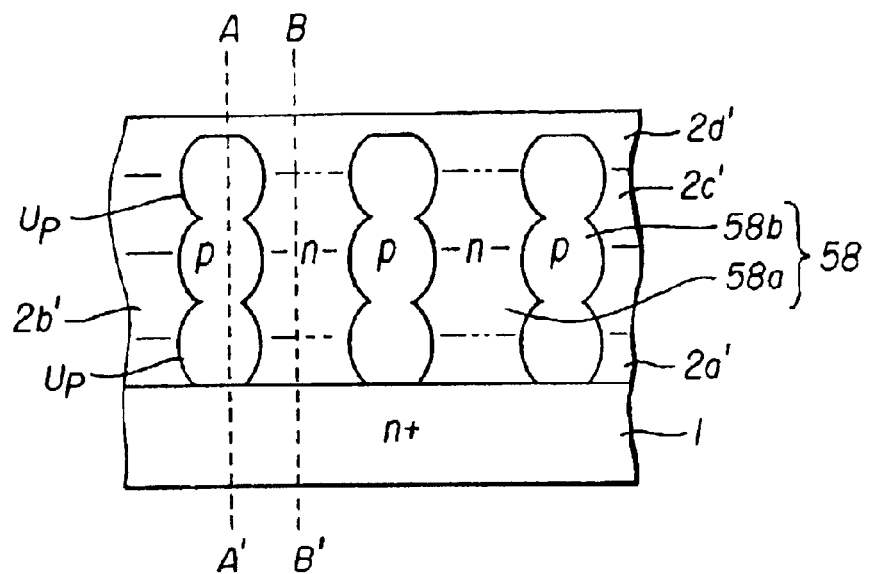
Figure 6A:
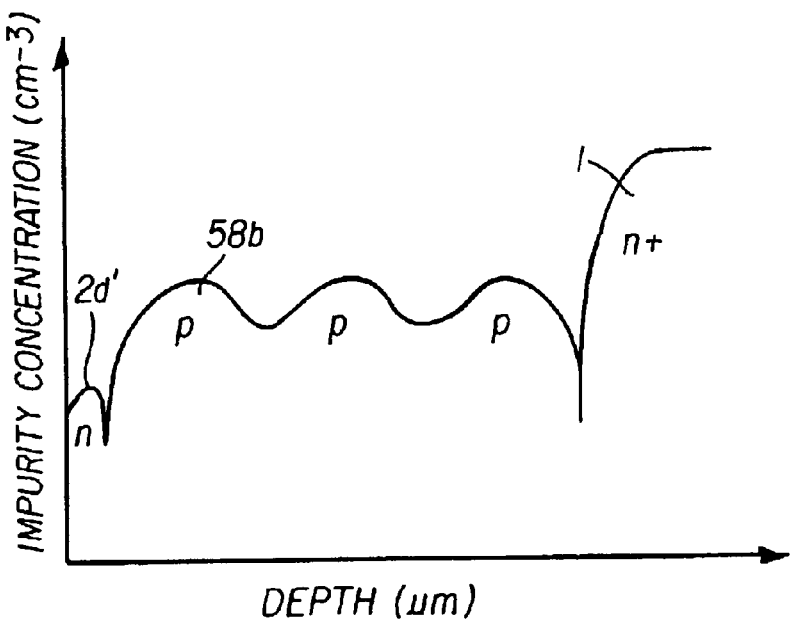

FIG. 6(a) is a graph showing the impurity concentration distribution profile in the cross section A–A' of FIG. 5(e).

Figure 6B:
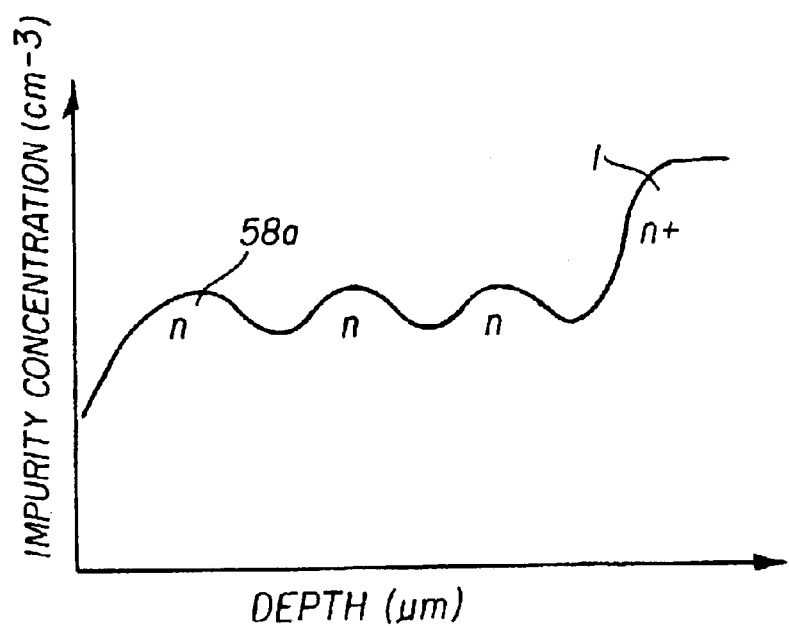

FIG. 6(b) is a graph showing the impurity concentration distribution profile in the cross section B–B' of FIG. 5(e).

Figure 7A:
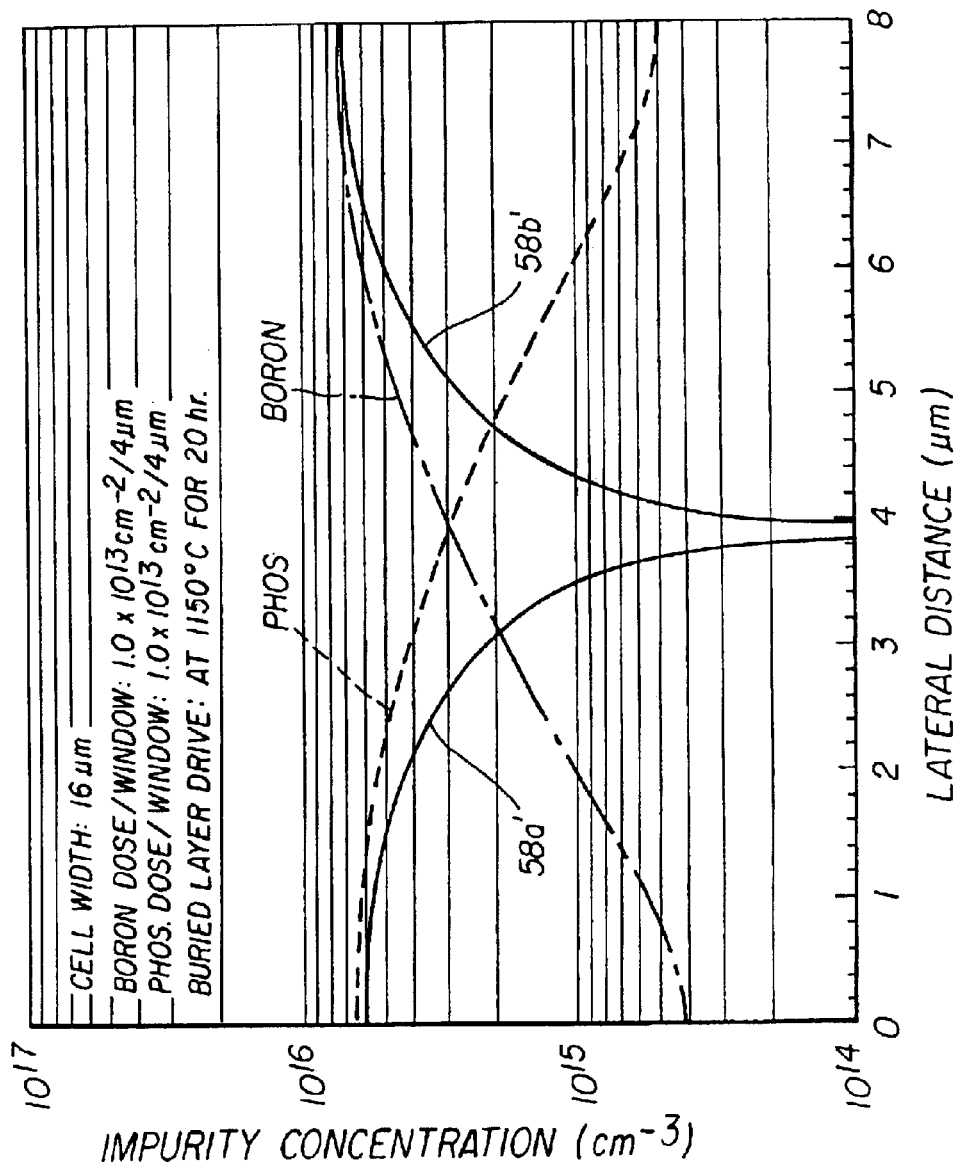

FIG. 7(a) is a graph showing the simulated impurity concentration distribution profile in the lateral (length) direction of the alternating-conductivity-type drain drift layer including n-type drift current path regions formed by selective ion implantation and p-type partition regions formed by selective ion implantation.

Figure 7B:
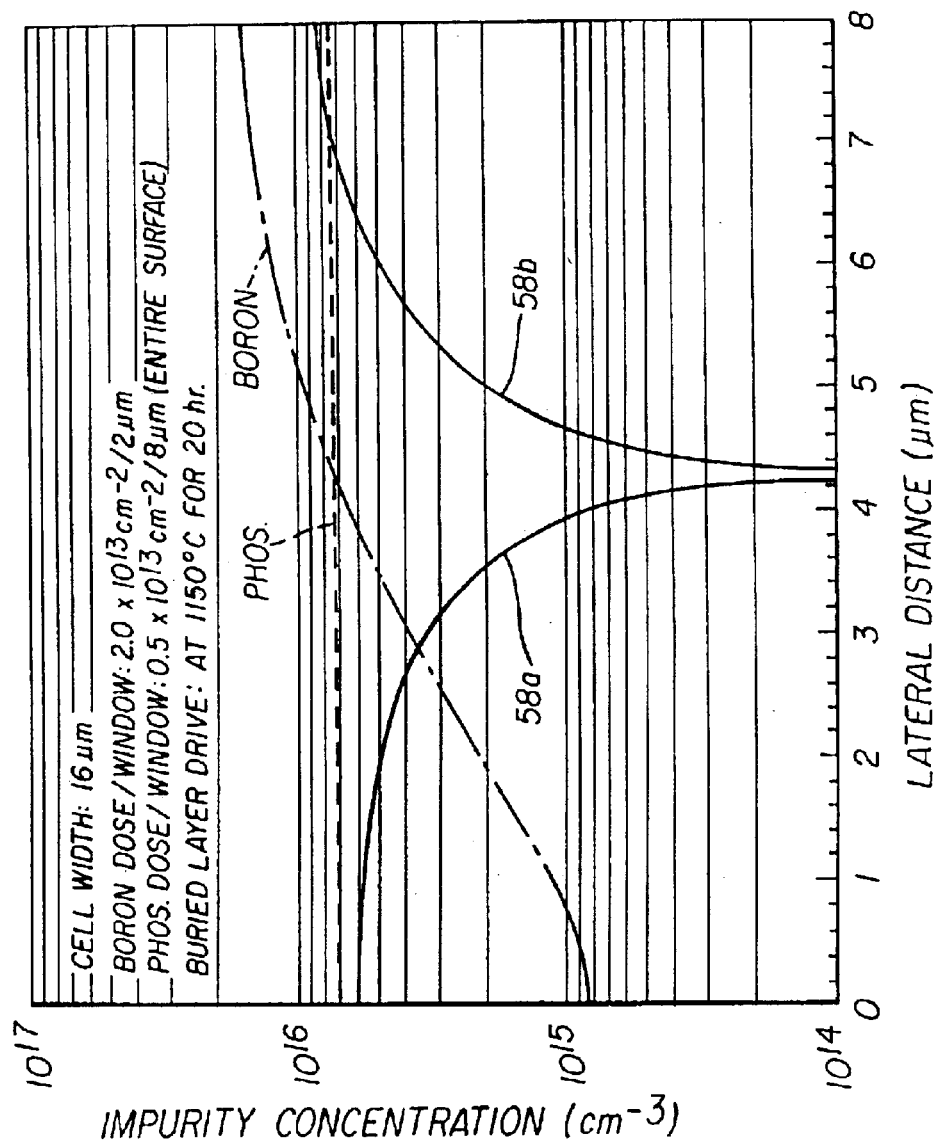

FIG. 7(b) is a graph showing the simulated impurity concentration distribution profile in the lateral (length)

direction of the alternating-conductivity-type drain drift layer including n-type drift current path regions according to the third embodiment.

FIGS. 8(a) through 8(f) are cross sectional views for explaining a method of manufacturing a vertical MOSFET according to a fourth embodiment of the invention.

Figure 9:
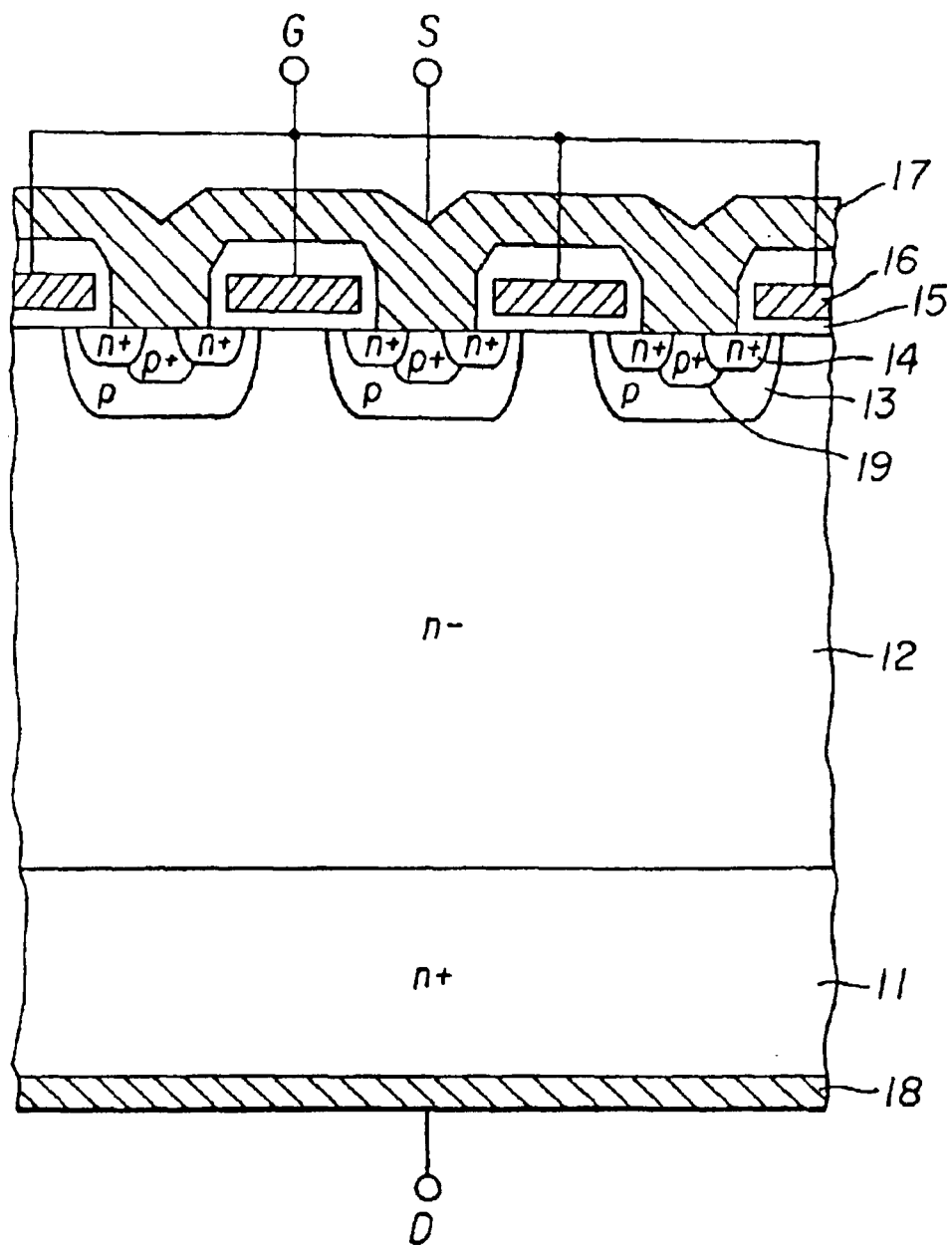

FIG. 9 is a cross sectional view of a conventional planar-type vertical n-channel MOSFET.

Figure 10:
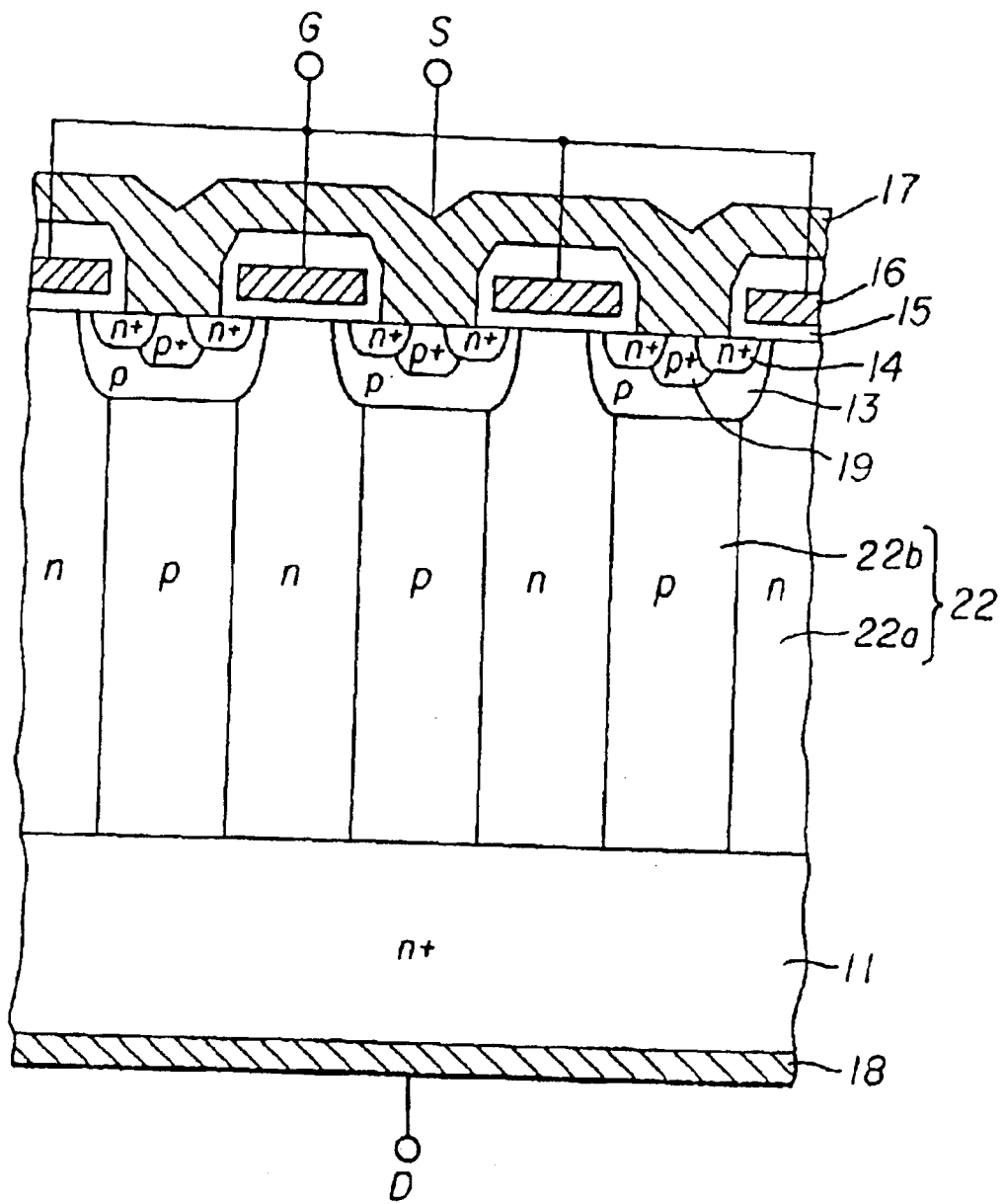

FIG. 10 is a cross sectional view of the vertical MOSFET disclosed in U.S. Pat. No. 5,216,275.

DETAILED DESCRIPTION OF THE PREFERRED EMBODIMENTS OF THE INVENTION

Now the invention will be explained hereinafter with reference to the accompanied drawing figures which illustrate the preferred embodiments of the invention.

First Embodiment

Figure 1:
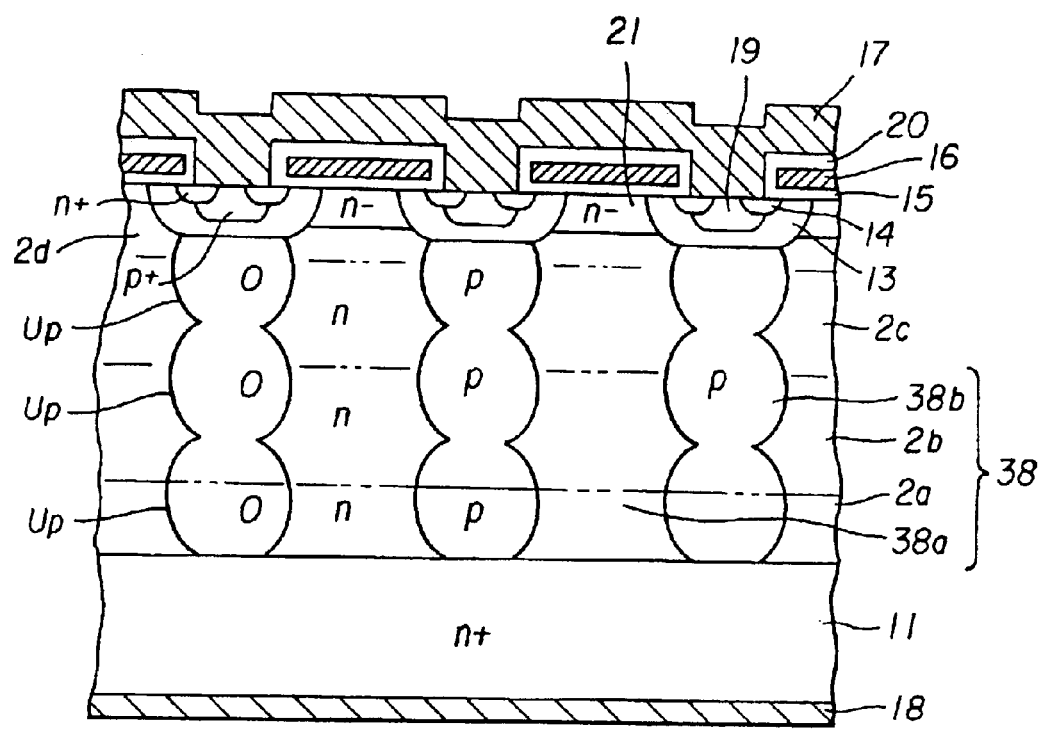

FIG. 1 is a cross sectional view of a vertical n-channel MOSFET according to a first embodiment of the invention.

Referring now to FIG. 1, the vertical n-channel MOSFET includes an $n^+$-type drain layer 11 with low electrical resistance; a drain electrode 18 in electrical contact with the back surface of $n^+$-type drain layer 11; an alternating-conductivity-type drain drift layer 38 on $n^+$-type drain layer 11; p-type base regions (p-type well regions or channel diffusion regions) 13 formed selectively in the surface portion of drain drift layer 38; a heavily doped $n^+$-type source region 14 formed selectively in the surface portion of p-type base region 13; a heavily doped $p^+$-type contact region 19 formed selectively in the surface portion of p-type base region 13; a gate insulation film 15 on the extended portion of p-type base region 13 extended between $n^+$-type source region 14 and an n-type drain region 21 described later; a polysilicon gate electrode 16 on gate insulation film 15; and a source electrode 17 in contact commonly with $n^+$-type source region 14 and $p^+$-type contact region 19. The $n^+$-type source region 14, formed shallowly in well-shaped p-type base region 13, constitutes a double-diffusion type MOS portion. An interlayer insulation film 20 covers gate electrode 16. The n-type drain region 21, more lightly doped than $n^+$-type drain layer 11, is formed beneath gate insulation film 15 to define the threshold voltage Vth of the MOS portion between p-type base regions 13 and 13 (assuming that the threshold voltage Vth is substantially independent of the voltage between the source and the drain). The p-type base region 13 connected electrically to source electrode 17 via $p^+$-type contact region 19 facilitates preventing latching up from occurring.

As described later, alternating-conductivity-type drain drift layer 38 is a thick laminate formed by laminating epitaxially grown layers 2a through 2d on $n^+$-type drain layer 11. In drain drift layer 38, narrow n-type drift current path regions 38a and narrow partition regions 38b are arranged alternately with each other. Drift current path regions 38a and partition regions 38b extend in perpendicular to $n^+$-type drain layer 11. The upper end of drift current path region 38a contacts with n-type drain region 21 and the lower end of drift current path region 38a with $n^+$-type drain layer 11.

The upper end of partition region 38b contacts with p-type base region 13 and the lower end of partition region 38b with $n^+$-type drain layer 11. In the first embodiment, partition region 38b is formed of a plurality (three steps) of p-type buried diffusion unit region $U_p$ connected vertically. The n-type drift current path region 38a is between a pair of partition regions 38b on both sides.

Since each buried diffusion unit region $U_p$ is formed by almost isotropic diffusion from a diffusion center O in the cross section shown in FIG. 1, the pn-junction planes are exaggerated by spherical planes to illustrate the impurity concentration distribution. In practice, he pn-junction planes are almost flat. The pn-junction planes are described by the same exaggerated illustration in FIGS. 2(d), 4(d), 4(e), 5(e), 5(f), 8(e) and 8(f).

Since p-type partition region 38b is formed of a plurality of p-type buried diffusion unit region $U_p$ connected vertically, the impurity concentration in p-type partition region 38b decreases in an isotropic manner from the diffusion centers O periodically scattered vertically in p-type partition region 38b. In short, the impurity distribution in p-type partition region 38b is not uniform.

Since the alternating conductivity type layer according to the invention facilitates increasing the impurity concentration in drift current path regions 38a, through which a drift current flows in the ON-state of the device, the alternating conductivity type layer according to the invention facilitates realizing a high current capacity. Since depletion layers expand laterally from both pn-junctions between drift current path regions 38a and partition regions 38b, the alternating conductivity type layer according to the invention also facilitates realizing a high breakdown voltage. Since the upper end of drift current path region 38a contacts with n-type drain region 21 formed as a surface layer between p-type base regions 13 and 13, the threshold voltage of the MOSFET according to the first embodiment is not affected by the voltage between the drain and the source even when the impurity concentration in drift current path regions 38a is high.

Since drain drift layer 38 is formed of n-type epitaxially grown layers 2a through 2d and chains of p-type buried diffusion unit regions $U_p$ connected vertically across n-type epitaxially grown layers 2a through 2d, drain drift layer 38 is formed easily by repeating the steps of epitaxial growth of an n-type epitaxially grown layer, implantation of a p-type impurity and a heat treatment. However, since it is cumbersome to repeatedly conduct the step of heat treatment and repeated heat treatments impair the crystal quality in the laminated epitaxially grown layers, it is recommended to conduct the heat treatment (thermal drive) once at the final stage of forming drain drift layer 38. The once and final heat treatment is conducted to directly connect p-type buried diffusion unit regions $U_p$, vertically aligned across the laminate of n-type epitaxially grown layers 2a through 2d, with each other. The MOSFET according to the first embodiment is manufactured easily, since it is not necessary to dig narrow and deep trenches by etching nor to grow epitaxially grown layers in the trenches with such a large aspect ratio. The MOSFET according to the first embodiment is manufactured easily, since drift current path regions 38a and partition regions 38b are narrowed and elongated easily. Since it is enough for the manufacturing process of the MOSFET to implant impurity ions of only one conductivity type, the number of the steps of implanting impurity ions is reduced.

Now the method for forming the alternating-conductivity-type drain drift layer is explained with reference to FIGS. 2(a) through 2(d). FIGS. 2(a) through 2(d) are cross sectional views for explaining the steps of forming the alternating-conductivity-type drain drift layer shown in FIG. 1.

Figure 2A:
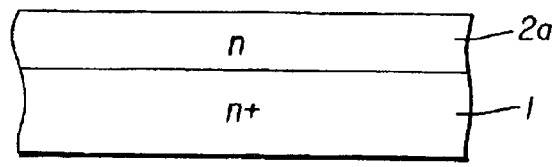

Referring now to FIG. 2(a), a first n-type epitaxially grown layer 2a doped relatively lightly is laminated on an $n^+$-type semiconductor substrate 1 with low electrical resistance.

Figure 2B:
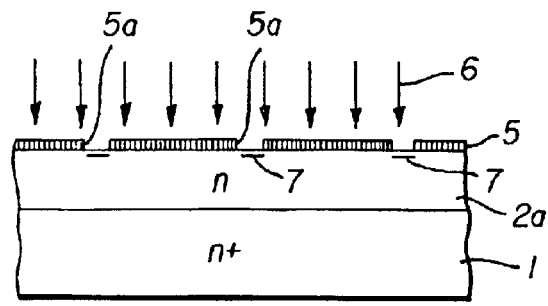

Referring now to FIG. 2(b), a resist mask 5, having windows 5a for implanting impurity ions opened at a certain interval, is formed on first n-type epitaxially grown layer 2a by photolithography. Boron ions 6 as the p-type impurity ions are implanted through the windows 5a into first n-type epitaxially grown layer 2a to introduce boron 7 in first n-type epitaxially grown layer 2a. The maximum concentration points (diffusion centers O) are located at the depth corresponding to the average range of boron ions 6 from the surface of first n-type epitaxially grown layer 2a.

Figure 2C:
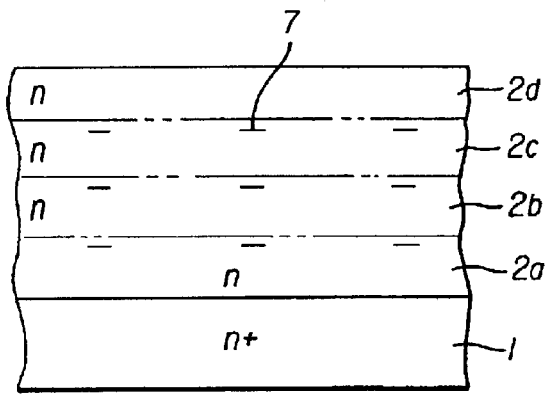

The step of epitaxial growth shown in FIG. 2(a) and the step of selective ion implantation shown in FIG. 2(b) are repeated considering the required breakdown voltage class as shown in FIG. 2(c). The locations of the windows on the n-type epitaxially grown layer at every succeeding selective ion implantation are adjusted at the initial locations of the windows 5a. In the first embodiment, the step of epitaxial growth and the step of selective ion implantation are repeated three times until epitaxially grown layers 2a through 2c are laminated. Then, an epitaxially grown layer 2d is laminated on epitaxially grown layer 2c. The epitaxially grown layers 2a through 2d are deposited to have the same thickness. Alternatively, boron ions are implanted at first into the n$^+$-type semiconductor substrate 1, the epitaxial growth step shown in FIG. 2(a) and the selective ion implantation step shown in FIG. 2(b) are reversed, and epitaxially grown layer 2d is not laminated.

Figure 2D:
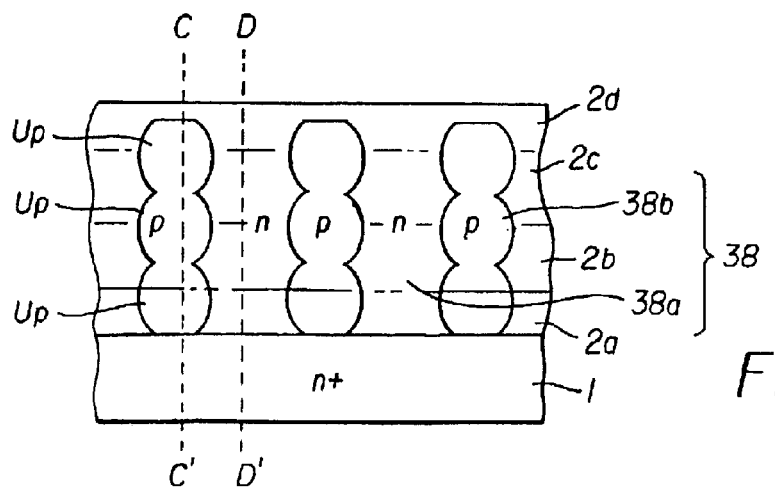

Finally, boron 7 implanted in advance into layers 2a through 2c is thermally driven at once to connect vertically aligned diffusion unit regions $U_p$ and to form p-type partition regions 38b as shown in FIG. 2(d).

Then, n-type drain regions 21 are formed on the surface of n-type epitaxially grown layer 2d and, finally, a double diffusion MOSFET is formed through the usual process.

Figure 3A:
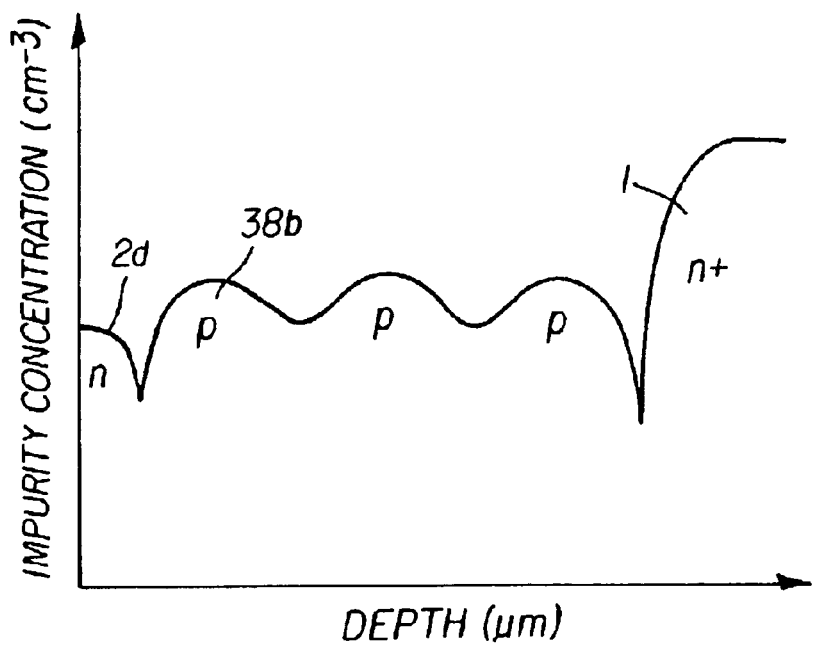
FIG. 3(a) is a graph showing the impurity concentration distribution profile in the cross section C–C' of FIG. 2(d).

FIG. 3(a) is a graph showing the impurity concentration distribution profile in the cross section C–C' of FIG. 2(d). Referring now to FIG. 3(a), a periodically changing concentration distribution, changing in the depth direction for every spacing between diffusion centers O on the three levels, is observed, since p-type partition region 38b is formed of three diffusion unit regions $U_p$ connected vertically with each other. As the thermal driving period is elongated, the periodicity of the concentration variation is reduced, resulting in a (flat) pn-junction plane between n-type drift current path region 38a and p-type partition region 38b shaped with a stripe and widened p-type partition regions 38b.

Figure 3B:
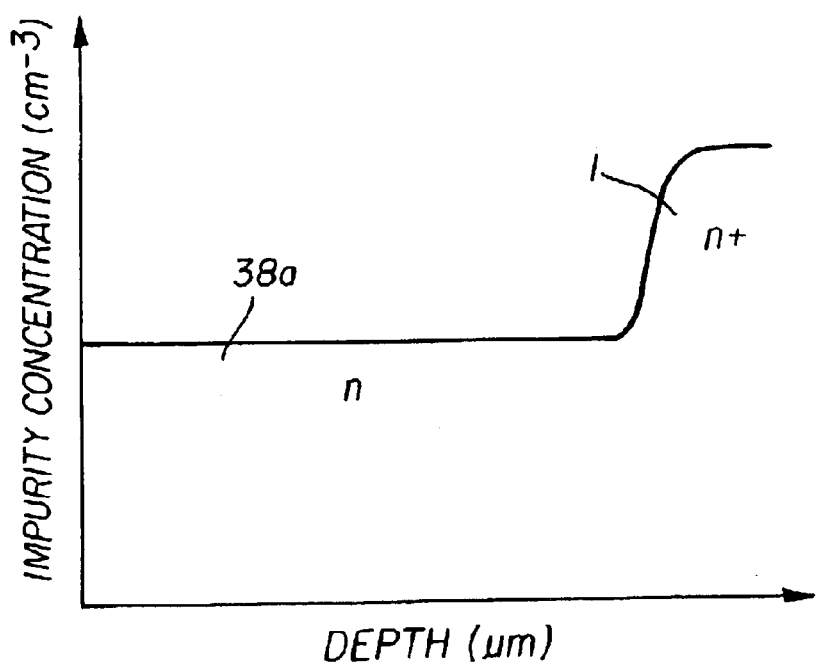
FIG. 3(b) is a graph showing the impurity concentration distribution profile in the cross section D–D' of FIG. 2(d).

FIG. 3(b) is a graph showing the impurity concentration distribution profile in the cross section D–D' of FIG. 2(d). Since n-type drift current path regions 38a are the residual regions, the conductivity type thereof is not inverted, remaining in n-type epitaxially grown layers 2a through 2d between p-type partition regions 38b formed by the thermal drive, the impurity concentration distribution in n-type drift current path regions 38a is almost uniform in the depth direction.

For obtaining a maximum breakdown voltage and a maximum current capacity, it is desirable to provide n-type drift current path regions 38a and p-type partition regions 38b with the same width and the same impurity concentration. The width of p-type partition regions 38b and the impurity concentration of p-type partition regions 38b are affected by the width of windows 5a and the amount of dose for the ion implantation. The width of p-type partition regions 38b and the impurity concentration of p-type partition regions 38b are affected also by the background, that is the impurity concentration distribution in epitaxially grown layers 2a through 2d. The preferable impurity concentration is $2\times10^{13}$ cm$^3$ or more, since a high impurity concentration in n-type drift current path regions 38a is indispensable to realize a high current capacity. When the impurity concentration variation in epitaxially grown layers 2a through 2d is too large, the depletion layer electric field becomes to high locally, exceeding the critical voltage of silicon. Since a too high impurity concentration causes impurity concentration variation, the preferable impurity concentration is $1\times10^{16}$ cm$^3$ or less.

The n-type drift current path regions 38a are the residual part (the regions, therein the conductivity type is not inverted) of n-type epitaxially grown layers 2a through 2d, therein p-type partition regions 38b are not formed by thermal drive. Since the impurity concentration in n-type drift current path regions 38a is affected by the background, that is the impurity concentration in epitaxially grown layers 2a through 2d, it is important to control the impurity concentration distribution.

In manufacturing the MOSFET according to the first embodiment, ion implantation is employed, since the ion implantation method facilitates positioning the maximum concentration points (the impurity sources) at the depth corresponding to the average range from windows 5a, through which impurity ions are implanted, and lowering the local impurity concentrations in the surface portions below the windows for ion implantation. Since the ion implantation method facilitates keeping the boundary planes between the epitaxially grown layers clean, the crystal qualities in the respective laminated epitaxially grown layers are equalized, the influences of auto-doping are reduced, and the impurity concentrations in epitaxially grown layers 2a through 2d, which determine the conductivity type of epitaxially grown layers 2a through 2d, are equalized. Since the crystal qualities in the epitaxially grown layers are impaired more with increasing number of the laminated epitaxially grown layers, the ion implantation method is very useful for manufacturing the devices including an active region (the active region of the transistors or the passive region of the diodes) formed on the uppermost epitaxially grown layer 2d. Although defect (amorphous) layers are caused in the surface portions corresponding to the locations of the windows, through which the impurity ions are implanted, the defect layers do not pose any problems, since the defect layers are annealed easily to be crystallized again by the thermal drive. Even when defects caused by the ion implantation are remaining, the remaining defects do not pose any problem, since the defects remain not in n-type drift current path region 38a but around the diffusion centers O in p-type partition regions 38b for expanding depletion layers and the portions around the diffusion centers O are depleted at the final stage of depletion layer expansion.

As described above, the concentration deviations are suppressed more effectively as the width of windows 5a for ion implantation becomes narrower. Since the array of point defects is confined within the selected narrow region beneath the surface portion corresponding to the window for ion implantation, the point defects do not pose any problem on the drift current path regions. In the first embodiment, one window 5a is assigned to forming one stripe of p-type partition region 38b. Alternatively, a plurality of windows 5a aligned may be assigned to forming one stripe of p-type partition region 38b.

The manufacturing method according to the first embodiment repeats the step of epitaxial layer growth and the step of ion implantation and finally diffuses implanted impurities through the step of thermal drive to obtain the alternatingconductivity-type drain drift layer 38 shown in FIG. 1. The manufacturing method according to the first embodiment facilitates manufacturing the alternating-conductivity-type drain drift layer 38, since it is not necessary to dig trenches with a large aspect ratio nor to selectively grow epitaxially grown layers in the trenches. The manufacturing method according to the first embodiment is very effective for reducing the steps of doping, since it is enough to dope impurities of one conductivity type and it is not necessary to dope impurities of both conductivity types.

Second Embodiment

FIGS. 4(a) through 4(e) are cross sectional views for explaining a method of manufacturing a vertical MOSFET according to a second embodiment of the invention.

Figure 4A:
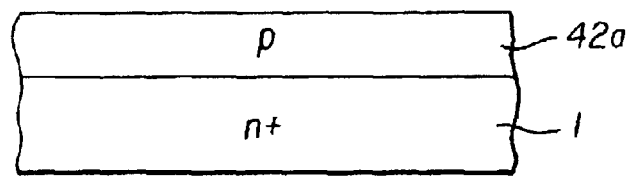
Figure 4B:
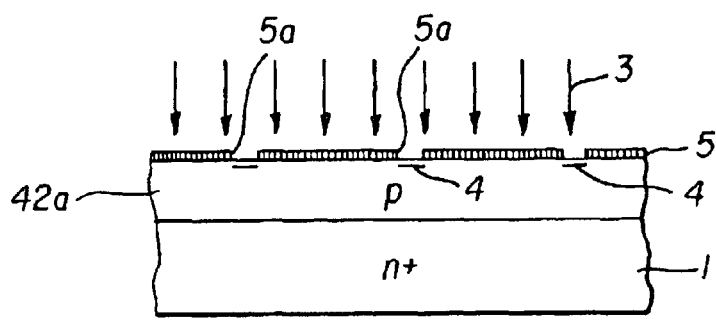
Figure 4C:
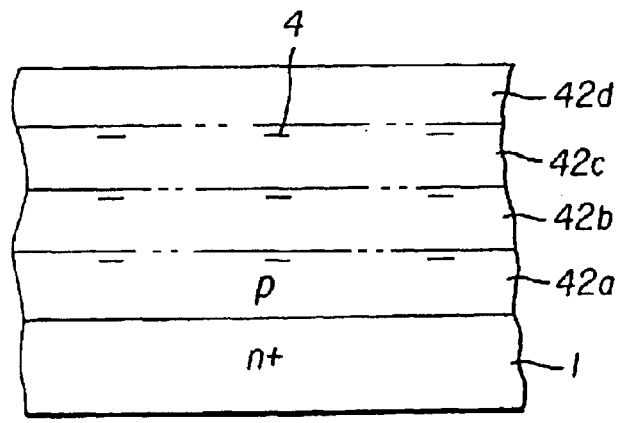
Figure 4D:
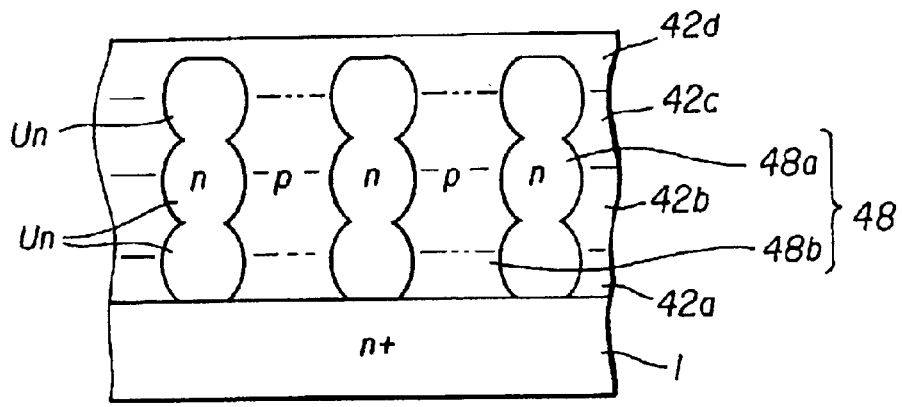
Figure 4E:
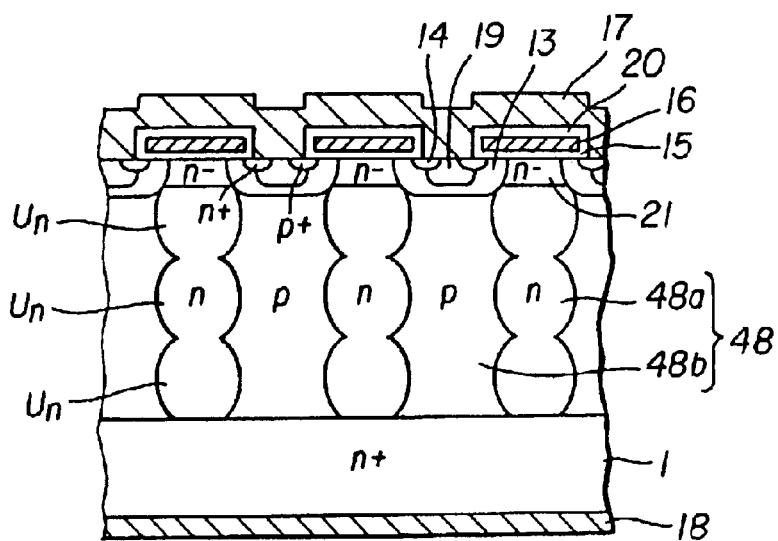

The vertical MOSFET according to the second embodiment includes a drain drift layer 48, that is different, as shown in FIG. 4(e), from drain drift layer 38 of the vertical MOSFET according to the first embodiment. Referring now to FIG. 4(e), drain drift layer 48 includes n-type drift current path regions 48a, each formed of n-type buried diffusion unit regions $U_n$ connected vertically with each other across p-type epitaxially grown layers 42a through 42d laminated with each other.

Referring now to FIG. 4(a), a p-type epitaxially grown layer 42a is laminated on an n-type semiconductor substrate 1 with low electrical resistance.

Referring now to FIG. 4(b), a resist mask 5, having narrow windows 5a for ion implantation opened at a certain interval, is formed on p-type epitaxially grown layer 42a by photolithography. Phosphorus 4 are doped into epitaxially grown layer 42a beneath windows 5a by implanting phosphorus ions 3 as an n-type impurity through windows 5a. The locations, thereat the maximum concentration of the doped phosphorus 4 is caused (the maximum concentration points of the implanted phosphorus ion), are at the depth, corresponding to the average range of the implanted phosphorus ions, from the surface of highly resistive epitaxially grown layer 42a.

Referring now to FIG. 4(c), the step of epitaxial growth shown in FIG. 4(a) and the step of selective ion implantation shown in FIG. 4(b) are repeated multiple times considering the required breakdown voltage class. The locations of the windows on the p-type epitaxially grown layer at every succeeding selective ion implantation are adjusted at the initial locations of the windows 5a. In the second embodiment, the step of epitaxial growth and the step of selective ion implantation are repeated three times until epitaxially grown layers 42a through 42c are laminated. Then, an epitaxially grown layer 42d is laminated on epitaxially grown layer 42c. The epitaxially grown layers 42a through 42d are deposited to have the same thickness. Alternatively, phosphorus ions are implanted at first into the n-type semiconductor substrate 1 with low electrical resistance, the epitaxial growth step shown in FIG. 4(a) and the selective ion implantation step shown in FIG. 4(b) are reversed, and epitaxially grown layer 42d is not laminated.

Phosphorus 4 implanted in advance into layers 42a through 42c is thermally driven at once to connect vertically aligned diffusion unit regions $U_n$ and to form n-type drift current path regions 48a as shown in FIG. 4(d).

Then, n-type drain regions 21 are formed on the surface of p-type epitaxially grown layer 42d and, finally, a double diffusion MOSFET is formed through the usual process.

A periodically changing concentration distribution, changing in the depth direction for every spacing between diffusion centers O on the three levels, is observed in n-type drift current path regions 48a in the same manner as in p-type partition regions 38b according to the first embodiment, since n-type drift current path region 48a is formed of three diffusion unit regions $U_n$ connected vertically with each other. Since p-type partition regions 48b are the residual regions, the conductivity type thereof is not inverted, remaining in p-type epitaxially grown layers 42a through 42d between n-type drift current path region 48a formed by the thermal drive, the impurity concentration distribution in p-type partition regions 48b is almost uniform in the depth direction.

The vertical MOSFET according to the second embodiment is different from the vertical MOSFET according to the first embodiment in that the conductivity type of epitaxially grown layer 42a in contact with the substrate is different from the conductivity type (n-type) of the substrate. The conductivity type of the impurity ions implanted according to the second embodiment is opposite to the conductivity type of the impurity ions implanted according to the first embodiment. The impurity concentration in n-type drift current path region 48a exhibits a periodical change in the depth direction. In spite of these differences, the manufacturing method according to the second embodiment exhibits the same effects with those of the first embodiment.

Third Embodiment

FIGS. 5(a) through 5(f) are cross sectional views for explaining a method of manufacturing a vertical MOSFET according to a third embodiment of the invention.

The vertical MOSFET according to the third embodiment has the same structure with that of the vertical MOSFET according to the first embodiment shown in FIG. 1. In forming the alternating conductivity type layer of the vertical MOSFET according to the first embodiment, n-type epitaxially grown layers 2a through 2d are laminated. In forming the alternating conductivity type layer of the vertical MOSFET according to the third embodiment, a step of laminating an n-type layer and a steps of implanting n-type impurities into the entire surface portion of the as laminated n-type layer are repeated.

Referring now to FIG. 5(a), a first n-type layer 2a' is epitaxially grown on an n-type semiconductor substrate with low electrical resistance.

Referring now to FIG. 5(b), n-type impurity phosphorus ions 3 are implanted into the entire surface portion (the entire portion, therein an alternating conductivity type layer is to be formed) of first n-type layer 2a' to implant phosphorus 4 at the depth corresponding to the average range from the surface of n-type layer 2a'.

Referring now to FIG. 5(c), a resist mask 5, having windows 5a for implanting impurity ions opened at a certain interval, is formed on first n-type epitaxially grown layer 2a' by photolithography. Boron ions 6 as the p-type impurity ions are implanted through the windows 5a into first n-type epitaxially grown layer 2a' to implant boron 7 in first n-type epitaxially grown layer 2a'. The maximum concentration points of the implanted boron 7 are located at the depth corresponding to the average range of boron ions 6 from the surface of first n-type epitaxially grown layer 2a'.

Referring now to FIG. 5(d), the step of epitaxial growth shown in FIG. 5(a), the step of ion implantation into the entire surface portion (hereinafter referred to as the "the step of non-selective ion implantation") shown in FIG. 5(b) and the step of selective implantation shown in FIG. 5(c) are repeated considering the required breakdown voltage class. The locations of the windows on the n-type epitaxially grown layer at every succeeding selective ion implantation are adjusted at the initial locations of the windows 5a. In the third embodiment, the step of epitaxial growth, the step of non-selective ion implantation and the step of selective ion implantation are repeated three times until epitaxially grown layers $2a'$ through $2c'$ are laminated. Then, an epitaxially grown layer $2d'$ is laminated on epitaxially grown layer $2c'$. Alternatively, phosphorus ions are implanted non-selectively into the surface portion of n$^+$-type semiconductor substrate 1 and boron ions are implanted selectively into the surface portion of n$^+$-type semiconductor substrate 1 prior to the first epitaxial growth step but epitaxially grown layer $2d'$ is not laminated.

Referring now to FIG. 5(e), the entire n-type impurity concentration in n-type epitaxially grown layers $2a'$ through $2d'$ is increased and vertically aligned p-type diffusion unit regions $U_p$ are connected with each other to form p-type partition regions 58b by thermally driving simultaneously phosphorus 4 implanted into the entire surface portions of n-type epitaxially grown layers $2a'$ through $2c'$ and selectively implanted boron 7. The regions, the conductivity type thereof is not inverted by the implanted p-type impurity, are left as n-type drift current path regions 58a.

Figure 5F:
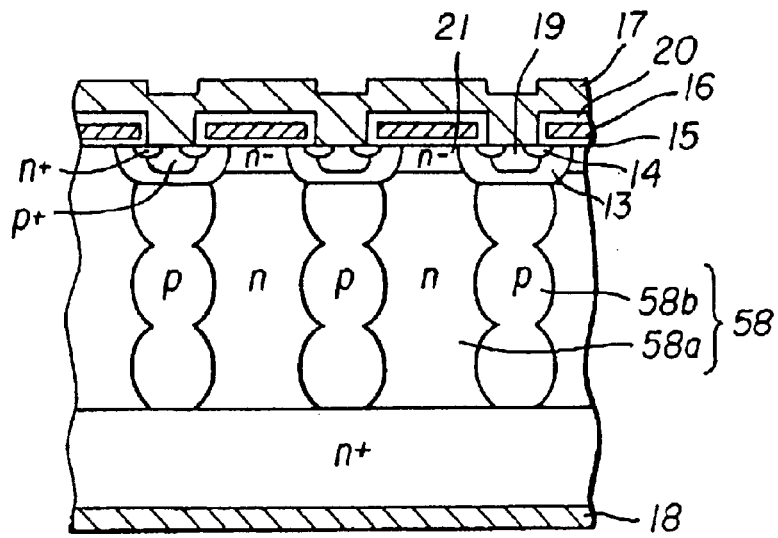

Referring now to FIG. 5(f), n-type drain regions 21 are formed on alternating-conductivity-type drain drift layer 58 and, finally, a double diffusion MOSFET is formed through the usual process.

Thus, by interposing a step of non-selective ion implantation between every pair of the epitaxial growth steps, the epitaxially grown layers are doped heavily or uniformly by the final thermal drive. The method of manufacturing the vertical MOSFET according to the third embodiment exhibits the same effects as those the method of manufacturing the vertical MOSFET according to the first embodiment does.

FIG. 6(a) is a graph showing the impurity concentration distribution profile in the cross section A–A' of FIG. 5(e). Corresponding to three diffusion unit regions $U_p$ connected vertically in p-type partition region 58b, periodical concentration change is caused three times in the depth direction at an interval corresponding to the spacing between the adjacent diffusion centers. FIG. 6(b) is a graph showing the impurity concentration distribution profile in the cross section B–B' of FIG. 5(e). Since n-type drift regions 58a are formed through the steps of non-selective ion implantation and the steps of thermal drive, periodical concentration change is caused three times in the depth direction of n-type drift region 58a at an interval corresponding to the spacing between the adjacent diffusion centers. As described later, the concentration distribution in the horizontal cross section of n-type drift current path region 58a is more uniform than the concentration distribution in the horizontal cross section of n-type drift current path region 38a according to the first embodiment due to the non-selective ion implantation. The impurity concentration in n-type drift current path regions 58a is determined by the non-selective ion implantation. Therefore, the conductivity type of epitaxially grown layers $2a'$ through $2d'$ at the time of the epitaxial growth thereof may be n-type or p-type. What is important is to suppress the impurity concentration at the time of the epitaxial growth at a low level. The low impurity concentration at the time of the epitaxial growth also facilitates realizing a high crystal quality.

For example, when the width of n-type drift current path region 58a and the width of p-type partition region 58b are the same 8 $\mu$m, the ideal impurity concentrations in n-type drift current path region 58a and p-type partition region 58b are the same $2\times10^{15}$ cm$^3$. When the width of n-type drift current path region 58a and the width of p-type partition region 58b are the same 0.8 $\mu$m, the ideal impurity concentrations in n-type drift current path region 58a and p-type partition region 58b are the same $3\times10^{16}$ cm$^3$. For suppressing the influence of impurity concentration variation in epitaxially grown layers $2a'$ through $2d'$ on the impurity concentrations in the regions 58a and 58b to 13 of the impurity concentration in the regions 58a and 58b of $2\times10^{15}$ cm$^3$, the impurity concentration in epitaxially grown layers $2a'$ through $2d'$ is preferably $7\times10^{14}$ cm$^3$ or lower. For the same purpose, the impurity concentration in epitaxially grown layers $2a'$ through $2d'$ is preferably $1\times10^{16}$ cm$^3$ or lower for the impurity concentration in the regions 58a and 58b of $3\times10^{16}$ cm$^3$. For suppressing the influence of impurity concentration variation in epitaxially grown layers $2a'$ through $2d'$ on the impurity concentrations in the regions 58a and 58b to 1100 of the impurity concentration in the regions 58a and 58b, the impurity concentration in epitaxially grown layers $2a'$ through $2d'$ may be reduced to $2\times10^{13}$ cm$^3$ for the width of the regions 58a and 58b of 8 $\mu$m and $3\times10^{14}$ cm$^3$ for the width of the regions 58a and 58b of 0.8 $\mu$m. Thus, narrower width of drift current path regions 58a and p-type partition regions 58b is more favorable to suppress the impurity concentration distributions in the regions 58a and 58b caused by the impurity concentration in epitaxially grown layers $2a'$ through $2d'$ within a narrow range, to prevent the depletion layer electric field from localizing and to obtain a high breakdown voltage, even if the impurity concentrations in the regions 58a and 58b are high.

FIG. 7(a) is a graph showing the simulated impurity concentration distribution profile in the lateral (length) direction of the alternating-conductivity-type drain drift layer including n-type drift current path regions formed by selective ion implantation and p-type partition regions formed by selective ion implantation. FIG. 7(b) is a graph showing the simulated impurity concentration distribution profile in the lateral (length) direction of the alternating-conductivity-type drain drift layer according to the third embodiment. In FIGS. 7(a) and 7(b), each of epitaxially grown layers $2a'$ through $2d'$ is 8 $\mu$m in thickness. In FIG. 7(a), phosphorus ions for forming the drift current path region and boron ions for forming the partition region are selectively implanted through respective windows of 4 m in width (each at the amount of dose of $1\times10^{13}$ cm$^2$) and, then, driven thermally at 1150° C. for 20 hr. In FIG. 7(b), phosphorus ions are implanted at the amount of dose of $0.5\times10^{13}$ cm$^2$ non-selectively into the surface portion of 8 $\mu$m in width, boron ions are implanted at the amount of dose of $2\times10^{13}$ cm$^2$ selectively through a window of 4 m in width, and then, the implanted impurities are driven thermally at 1150° C. for 20 hr. FIGS. 7(a) and 7(b) show the impurity concentration distribution profiles in the horizontal plane containing the diffusion center (spaced apart for 16 m from the surface of the layer 11 with low electrical resistance) in the second epitaxially grown layer.

In these figures, the phosphorus concentration profile is represented by a broken curve and the boron concentration profile by a single-dotted chain curve. The difference between the broken curve and the single-dotted chain curve defines n-type drift current path region 58a or 58a' and p-type partition region 58b or 58b'. In FIG. 7(a), n-type drift current path region 58a and p-type partition region 58b are formed by their own ion implantation processes. In FIG. 7(b), a uniform n-type impurity concentration distribution is obtained by non-selective phosphorus ion implantation for the width of 8 $\mu$m of epitaxially grown layers $2a'$ through $2d'$ and p-type partition region 58b is formed by selective boron ion implantation. As a result, the residual region of the selective boron ion implantation remains as n-type drift current path region 58a. The impurity concentration distribution in the lateral (horizontal) cross section across n-type drift current path region 58a is more uniform than that in the lateral (horizontal) cross section across n-type drift current path region 58a'. The phosphorus concentration represented by the broken curve in FIG. 7(b) is uniform ($7\times10^{16}$ cm$^{3}$) in the lateral cross section. Although the boron concentration represented by the single-dotted chain curve in FIG. 7(b) is around $1\times10^{16}$ cm$^{3}$ beneath window 5a (in the lateral distance range between 6 and 8 μm), the boron concentration at the lateral distance of 0 μm is lowered to around $8\times10^{14}$ cm$^{3}$ due to lateral diffusion.

The steps of non-selective ion implantation according to the third embodiment are excessive as compared with the manufacturing steps according to the first embodiment or the second embodiment. The p-type impurity concentration and the n-type impurity concentration are controlled by the respective ion implantation processes according to the third embodiment. According to the first embodiment and the second embodiment, the impurity concentration in the drift current path regions or the partition regions is controlled by ion implantation and the impurity concentration in the partition regions or the drift current path regions is controlled by impurity doping at the time of epitaxial growth. Due to the differences described above, the manufacturing method according to the third embodiment is more effective to greatly reduce the impurity concentration variation, to reduce the characteristics distributions and to improve the rate of non-defective devices as compared with the manufacturing methods according to the first embodiment and the second embodiment. Impurity concentration distribution is further reduced by using the ion implantation facilities of the same series supplied from the same manufacturer for implanting p-type impurity ions and for implanting n-type impurity ions. Impurity concentration distribution is reduced furthermore by using more preferably the ion implantation facilities of the same type supplied from the same manufacture and, most preferably the same implantation facility.

Fourth Embodiment

FIGS. 8(a) through 8(f) are cross sectional views for explaining a method of manufacturing a vertical MOSFET according to a fourth embodiment of the invention.

Figure 8A:
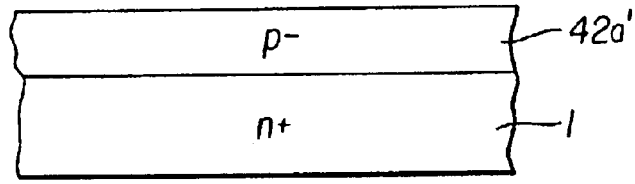
Figure 8B:
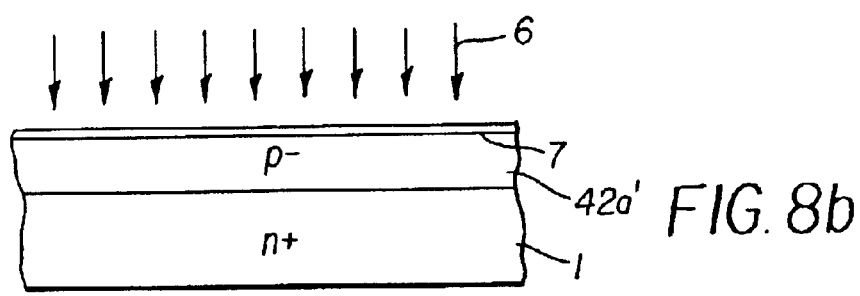

Referring at first to FIG. 8(b), the method of manufacturing a vertical MOSFET according to the fourth embodiment employs non-selective implantation of p-type impurity to lightly doped p-type epitaxially grown layers 42a' through 42d' according to the second embodiment (shown in FIGS. 4(a) through 4(e)).

Referring now to FIG. 8(a), a first p-type epitaxially grown layer 42a' is laminated on an n$^{+}$-type semiconductor substrate 1 with low electrical resistance.

Referring again to FIG. 8(b), p-type impurity boron ions 6 are implanted in the entire surface portion of p-type epitaxially grown layer 42a' (the entire region, therein an alternating conductivity type layer is to be formed) to dope boron ions 6 in the depth corresponding to the average range of the boron ions from the surface of p-type epitaxially grown layer 42a'.

Figure 8C:
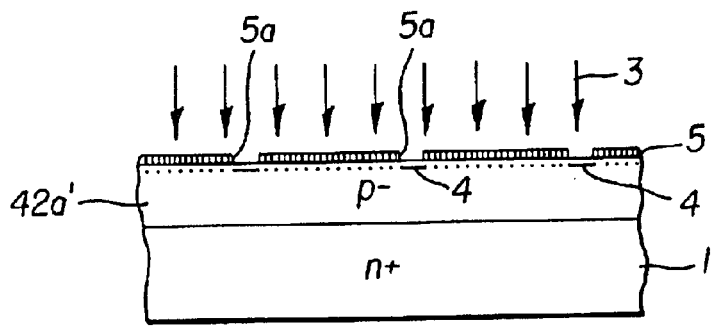

Referring now to FIG. 8(c), a resist mask 5, having windows 5a for implanting impurity ions opened at a certain interval, is formed on first p-type epitaxially grown layer 42a' by photolithography. Phosphorus ions 3 as the n-type impurity ions are implanted through the windows 5a into first p-type epitaxially grown layer 42a' to introduce phosphorus 4 in first p-type epitaxially grown layer 42a'. The maximum concentration points are located at the depth corresponding to the average range of phosphorus ions 3 from the surface of first p-type epitaxially grown layer 42a'.

Figure 8D:
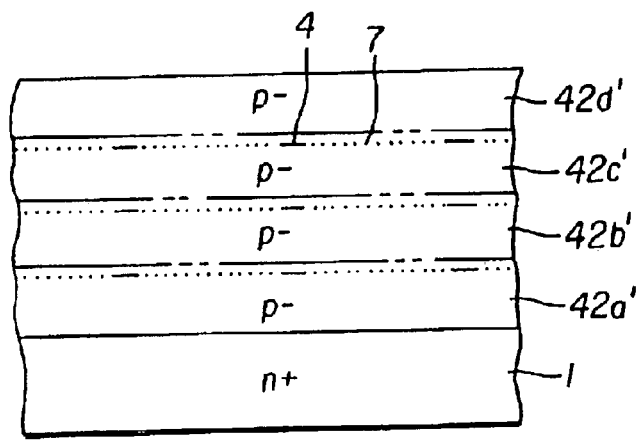

Referring now to FIG. 8(d), the step of epitaxial growth shown in FIG. 8(a), the step of non-selective ion implantation into the entire surface portion shown in FIG. 8(b) and the step of selective implantation shown in FIG. 8(c) are repeated considering the required breakdown voltage class. The locations of the windows on the p-type epitaxially grown layer at every succeeding selective ion implantation are adjusted at the initial locations of the windows 5a. In the fourth embodiment, the step of epitaxial growth, the step of nonselective ion implantation and the step of selective ion implantation are repeated three times until epitaxially grown layers 42a' through 42c' are laminated. Then, an epitaxially grown layer 42d' is laminated on epitaxially grown layer 42c'. Alternatively, boron ions are implanted non-selectively into the surface portion of n$^{+}$-type semiconductor substrate 1 and phosphorus ions are implanted selectively into the surface portion of n$^{+}$-type semiconductor substrate 1 prior to the first epitaxial growth step but epitaxially grown layer 42d' is not laminated.

Figure 8E:
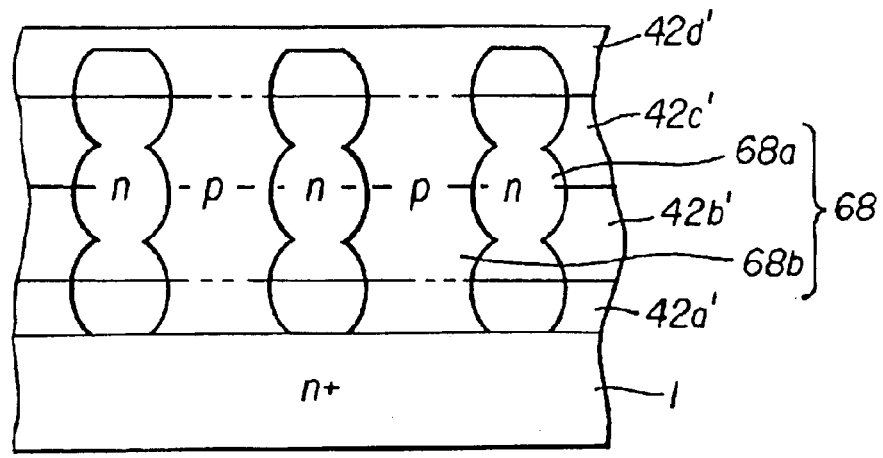

Referring now to FIG. 8(e), the entire p-type impurity concentration in p-type epitaxially grown layers 42a' through 42d' is increased and vertically aligned n-type diffusion unit regions $U_n$ are connected with each other to form n-type drift current path regions 68a by thermally driving boron 7 implanted into the entire surface portions of p-type epitaxially grown layers 42a' through 42c' and selectively implanted phosphorus 4 simultaneously. The regions, the conductivity type thereof is not inverted by n-type impurity, are left as p-type partition regions 68b.

Figure 8F:
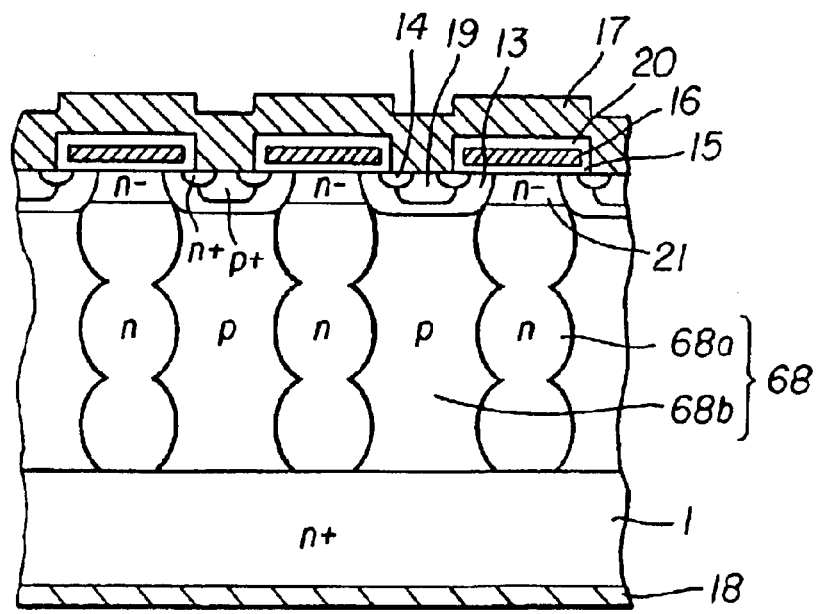

Referring now to FIG. 8(f), n-type drain regions 21 are formed on alternating-conductivity-type drain drift layer 68 and, finally, a double diffusion MOSFET is formed through the usual process.

Thus, by interposing a step of non-selective ion implantation between every pair of the epitaxial growth steps, the epitaxially grown layers are doped heavily or uniformly by the final thermal drive. The method of manufacturing the vertical MOSFET according to the fourth embodiment exhibits the same effects as those the method of manufacturing the vertical MOSFET according to the third embodiment does.

Corresponding to three diffusion unit regions $U_n$ connected vertically in n-type drift current path region 68a, periodical concentration change is caused three times in the depth direction at an interval corresponding to the spacing between the adjacent diffusion centers. Since p-type partition regions 68b are formed through the steps of non-selective ion implantation and the step of thermal drive, periodical concentration change is caused three times in the depth direction of p-type partition region 68b at an interval corresponding to the spacing between the adjacent diffusion centers. The concentration distribution in the horizontal cross section of p-type partition region 68b is more uniform than the concentration distribution in the horizontal cross section of p-type partition region 48b according to the second embodiment due to the non-selective ion implantation. In the fourth embodiment, the conductivity type of epitaxially grown layers 42a' through 2d' at the time of the epitaxial growth thereof may be n-type or p-type in the same way as in the third embodiment.

As explained above, the semiconductor device according to the invention includes an alternating-conductivity-type drain drift layer formed by laminating epitaxially grown layers and drift current path regions or partition regions formed by connecting buried diffusion unit regions vertically with each other. The semiconductor device according to the invention formed as described above exhibits the following effects.

The semiconductor device according to the invention facilitates realizing a high breakdown voltage and a high current density. The semiconductor device according to the invention facilitates narrowing the drift current path regions and the partition regions and elongating the drift current path regions and the partition regions, since the semiconductor device is formed according to the invention by laminating epitaxially grown layers with implantation of impurity ions of one conductivity type interposed between the steps of laminating and by connecting buried diffusion unit regions vertically through a single heat treatment step to form the drift current path regions or the partition regions. The manufacturing method according to the invention facilitates manufacturing a practical vertical super-junction semiconductor device easily, since it is not necessary for the manufacturing method according to the invention to dig trenches with a large aspect ratio and to selectively grow epitaxially grown layers in the trenches. The manufacturing method according to the invention facilitates reducing the manufacturing steps, reducing the manufacturing costs and confining concentration distributions within a tolerable range, since the manufacturing method according to the invention implants impurity ions of only one conductivity type and conducts heat treatment only once in the final stage of manufacture.

The manufacturing method according to the invention repeats the step of laminating an epitaxially grown layer of the first conductivity type or the second conductivity type on a semiconductor substrate and the step of implanting impurity ions of the first conductivity type or the second conductivity type into diffusion centers and finally connects diffusion unit regions vertically by thermally driving the implanted impurity ions from diffusion centers. The manufacturing method according to the invention facilitates narrowing the drift current path regions and the partition regions and elongating the drift current path regions and the partition regions. Due to the employment of the ion implantation steps, the boundary planes between the epitaxially grown layers are kept clean. Due to the clean boundary planes between the epitaxially grown layers, the manufacturing method according to the invention facilitates providing the epitaxially grown layers with a uniform crystal quality. The manufacturing method according to the invention also facilitates reducing the adverse effect of auto-doping and providing the epitaxially grown layers with a uniform impurity concentration of any conductivity type. Defect (amorphous) layers caused by the ion implantation in the implanted surface portions do not pose any serious problem, since the defect layers may be crystallized again by the heat treatment.

Preferably, the step of non-selectively implanting impurity ions of the second conductivity type or the first conductivity type is interposed between the preceding epitaxial growth step and the succeeding epitaxial growth step. This step sequence facilitates heavily doping the drift current path regions and reducing the impurity concentration variations therein.

What is claimed is:

1. A method of manufacturing a semiconductor device including an alternating conductivity type layer formed of vertical first regions of a first conductivity type and vertical second regions of a second conductivity type, the vertical first regions and the vertical second regions being alternately arranged with each other, each of the vertical first regions or each of the vertical second regions being formed of epitaxially grown layers laminated with each other, each of the vertical second regions or each of the vertical first regions being formed of buried diffusion unit regions connected vertically with each other, and each of the vertical first regions and each of the vertical second regions including a vertical impurity concentration profile comprising at least one peak and at least two valleys, the method comprising the steps of:
   (a) forming an epitaxially grown layer doped relatively lightly on a substrate;
   (b) non-selectively implanting impurity ions of the first conductivity type or the second conductivity type in the entire surface portion of the epitaxially grown layer;
   (c) selectively implanting impurity ions of the second conductivity type or the first conductivity type into diffusion centers in the surface portion of the epitaxially grown layer;
   (d) repeating the steps (a) through (c) to form a laminate including a desired number of the diffusion centers aligned vertically; and
   (e) thermally diffusing the implanted impurity ions from the diffusion centers, to connect the buried diffusion unit regions vertically with each other.

2. The method according to claim 1, wherein the substrate is of the first conductivity type and exhibits low electrical resistance.

3. The method according to claim 1, wherein the impurity concentration in the epitaxially grown layers is $1 \times 10^{16}$ cm$^3$ or less.

4. The method according to claim 1, wherein the impurity concentration in the epitaxially grown layers is $2 \times 10^{13}$ cm$^3$ or more.

5. The method according to claim 1, wherein the repeated steps of selectively implanting are conducted using ion implantation facilities of the same series supplied from a same manufacturer.

6. The method according to claim 5, wherein the ion implantation facilities are of the same type supplied from the same manufacturer.

7. The method according to claim 1, wherein the steps of implanting ions of the first conductivity type and implanting the ions of the second conductivity type are conducted using respective ion implantation facilities of the same series supplied from a same manufacturer.

8. The method according to claim 1, wherein all the steps of implanting impurity ions are conducted using a same ion implantation facility.

9. A method of manufacturing a semiconductor device including an alternating conductivity type layer formed of vertical first regions of a first conductivity type and vertical second regions of a second conductivity type, the vertical first regions and the vertical second regions being alternately arranged with each other, each of the vertical first regions or each of the vertical second regions being formed of epitaxially grown layers laminated with each other, each of the vertical second regions or each of the vertical first regions being formed of buried diffusion unit regions connected vertically with each other, and each of the vertical first regions and each of the vertical second regions including a vertical impurity concentration profile comprising at least one peak and at least two valleys, the method comprising the steps of:
   (a) selectively implanting impurity ions of the second conductivity type or the first conductivity type into diffusion centers in the surface portion of a substrate;
   (b) forming an epitaxially grown layer doped relatively lightly on the substrate;
   (c) non-selectively implanting impurity ions of the first conductivity type or the second conductivity type in the entire surface portion of the epitaxially grown layer;

(d) selectively implanting impurity ions of the second conductivity type or the first conductivity type into diffusion centers in the surface portion of the epitaxially grown layer;

(e) repeating the steps (b) through (d) to form a laminate including a desired number of the diffusion centers aligned vertically; and (f) thermally diffusing the implanted impurity ions from the diffusion centers to connect the buried diffusion unit regions vertically with each other.

10. The method according to claim 9, wherein the substrate is of the first conductivity type and exhibits low electrical resistance.

11. The method according to claim 9, wherein the impurity concentration in the epitaxially grown layers is $1 \times 10^{16}$ cm$^3$ or less.

12. The method according to claim 9, wherein the impurity concentration in the epitaxially grown layers is $2 \times 10^{13}$ cm$^3$ or more.

13. The method according to claim 9, wherein the repeated steps of selectively implanting are conducted using ion implantation facilities of the same series supplied from a same manufacturer.

14. The method according to claim 13, wherein the ion implantation facilities are of the same type supplied from the same manufacturer.

15. The method according to claim 9, wherein the steps of implanting ions of the first conductivity type and implanting the ions of the second conductivity type are conducted using respective ion implantation facilities of the same series supplied from a same manufacturer.

16. The method according to claim 9, wherein all the steps of implanting impurity ions are conducted using a same ion implantation facility.

* * * * *